United States Patent
Kim et al.

(10) Patent No.: US 6,693,018 B2
(45) Date of Patent: Feb. 17, 2004

(54) METHOD FOR FABRICATING DRAM CELL TRANSISTOR HAVING TRENCH ISOLATION STRUCTURE

(75) Inventors: Hee Sang Kim, Kyoungki-do (KR); Sung Kye Park, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/330,617

(22) Filed: Dec. 27, 2002

(65) Prior Publication Data

US 2003/0199136 A1 Oct. 23, 2003

(30) Foreign Application Priority Data

Apr. 23, 2002 (KR) ........................................ 2002-22120

(51) Int. Cl.[7] .......................................... H01L 21/8242
(52) U.S. Cl. ...................... 438/418; 438/424; 438/243; 438/248
(58) Field of Search ................................ 438/238–240, 438/243–249, 381, 386–392, 414–438

(56) References Cited

U.S. PATENT DOCUMENTS 5,223,447 A * 6/1993 Lee et al. .................... 438/247
6,080,638 A   6/2000 Lin et al.
6,103,592 A   8/2000 Levy et al.
6,150,686 A  11/2000 Sugiura et al.
6,228,745 B1  5/2001 Wheeler et al.

* cited by examiner

Primary Examiner—Jey Tsai
(74) Attorney, Agent, or Firm—Ladas & Parry

(57) ABSTRACT

The present invention relates to a method for fabricating a DRAM cell transistor having a trench isolation structure, which can prevent the reduction in effective channel length and the deterioration of a punch-through characteristic at the edge portion of a field oxide film, which is caused by the reduction in the potential barrier between a junction region and a channel region, which is caused because the channel doping concentration at the edge portion of the field oxide film is lowered due to a boron segregation effect caused by the field oxide film, as compared to the central portion of a channel region. According to the method of the present invention, an electrode structure having the same conductive type as that of a well region is formed within the field oxide film. Thus, a back bias is applied to the well region, and at the same time, also applied to the electrode formed within the field oxide film, so that the electric potential at the edge portion of the field oxide film is increased and the potential barrier between the junction region and the channel region is increased, thereby improving the punch-through characteristic.

10 Claims, 8 Drawing Sheets

METHOD FOR FABRICATING DRAM CELL TRANSISTOR HAVING TRENCH ISOLATION STRUCTURE

BACKGROUND OF THE INVENTION

1. Field of the Invention

The present invention relates in general to a method for fabricating a semiconductor device, and more particularly to a method for fabricating a DRAM cell transistor having a trench isolation structure.

2. Description of the Prior Art

A thermally grown silicon oxide film has an action of absorbing boron ions implanted into a silicon substrate. This phenomenon is called a "boron segregation effect". Thus, in a general MOS transistor having a shallow trench isolation (STI) structure, channel doping concentration is reduced due to the boron segregation effect caused by a field oxide film formed within a trench, as it approaches to the field oxide film. This causes the reduction in effective channel length and the deterioration of a punch-through characteristic.

Figure 1:
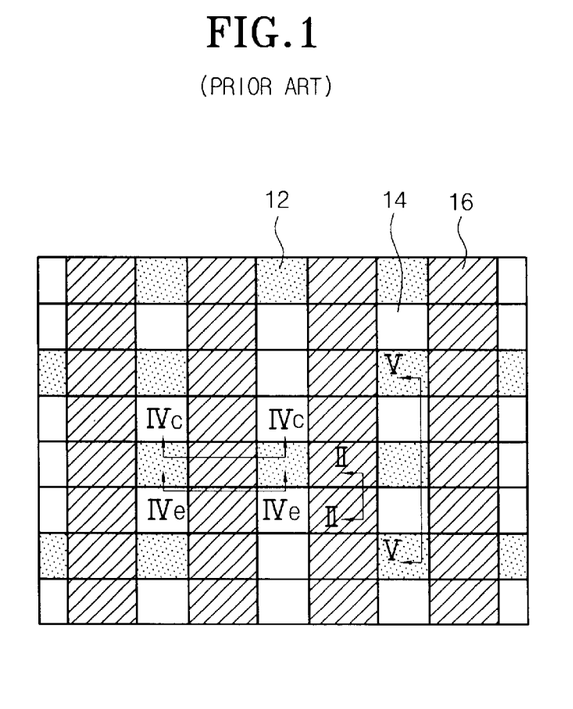
FIG. 1 is a plan view showing the schematic structure of a DRAM cell transistor according to the prior art.
Figure 2:
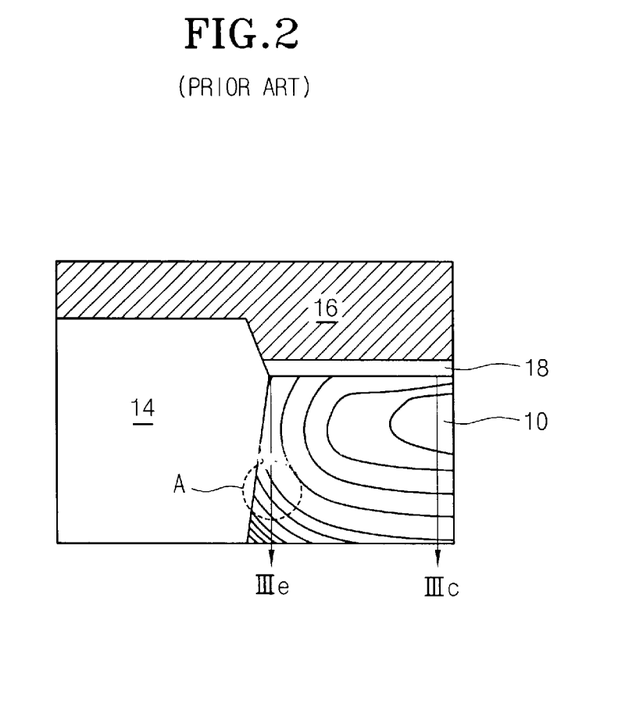
FIG. 2 is a cross-sectional view taken along the line II—II of FIG. 1, which shows the channel doping concentration distribution of a silicon substrate.
Figure 3:
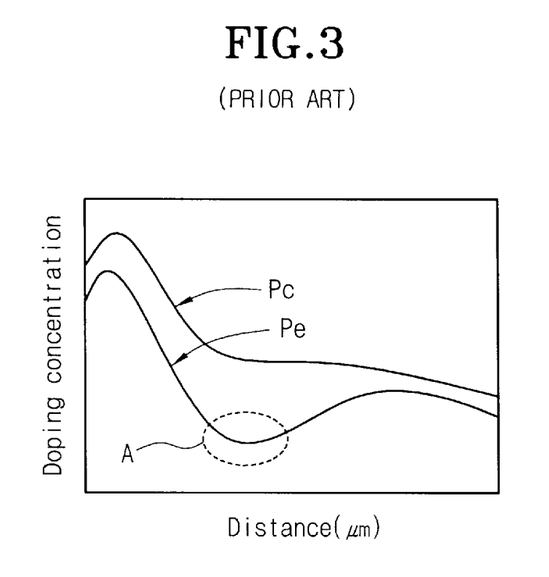
FIG. 3 is a graph showing channel doping concentration according to depth, in which Pc and Pe show channel doping concentration according to depth, based on the lines IIIc and IIIe of FIG. 2, respectively.
Figure 4:
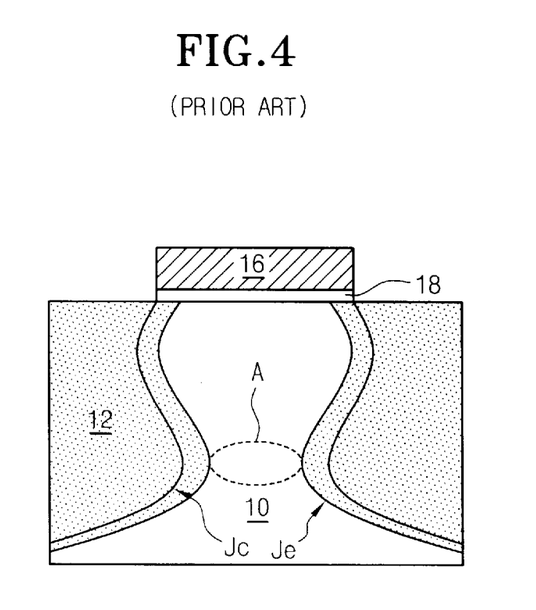
FIG. 4 is a cross-sectional view taken along the lines IVc—IVc and IVe—IVe and of FIG. 1, in which Jc and Je show the comparison between lateral profiles of junction regions in the sections taken along the lines IVc—IVc and IVe—IVe of FIG. 1, respectively.

Hereinafter, the schematic structure of a DRAM cell transistor according to the prior art, and the shortcomings of this DRAM cell transistor, will be described with reference to FIGS. 1 to 4. FIG. 1 is a plan view showing the schematic structure of a DRAM cell transistor according to the prior art. FIG. 2 is a cross-sectional view taken along the line II—II of FIG. 1, which shows the channel doping concentration distribution of a silicon substrate. FIG. 3 is a graph showing channel doping concentration according to depth, in which Pc and Pe show channel doping concentration according to depth, based on the lines IIIc and IIIe of FIG. 2, respectively. Moreover, FIG. 4 is a cross-sectional view taken along the lines IVc—IVc and IVe—IVe and of FIG. 1, in which Jc and Je show the comparison between the lateral profiles of junction regions in the sections taken along the lines IVc—IVc and IVe—IVe of FIG. 1, respectively.

As well known, in order to electrically isolate DRAM cell transistors from each other, a trench-shaped field oxide film 14 is formed within a silicon substrate 10 at a fixed region. In order to control the threshold voltage of the transistor, channel ions are implanted into the active region of the silicon substrate 10, which is defined by the field oxide film 14. Furthermore, a gate oxide 18, a gate line 16 and a source/drain junction region 12 are successively formed on the resulting structure.

As described above, the doping concentration caused by the channel ion implantation is reduced due to the boron segregation effect, as it approaches to the field oxide film 14. Namely, as shown in FIGS. 2 and 3, the edge portion of the field oxide film (shown as an A portion in FIG. 2) has the reduced channel doping concentration as compared to the central portion of the channel region. Accordingly, as shown in FIG. 4, the potential barrier between the channel region and the junction region 12 is lowered at the edge portion of the field oxide film, so that the effective channel length is reduced and the punch-through characteristic is deteriorated.

SUMMARY OF THE INVENTION

Accordingly, the present invention has been made to solve the above-mentioned problems occurring in the prior art, and an object of the present invention is to provide a method for fabricating a DRAM cell transistor, by which the electric potential at the edge portion of the field oxide film can be increased, so that the potential barrier between the source/drain junction region and the channel region can be increased and the punch-through characteristic can be improved.

To achieve the above object, the present invention provides a method for fabricating a DRAM cell transistor, in which an electrode structure having the same conductive type as that of a well region is formed within a trench-shaped field oxide film.

According to the present invention, a negative back bias is applied to the well region, and at the same time, also applied to the electrode formed within the field oxide film, so that the electric potential at the edge portion of the field oxide film is increased. Thus, the potential barrier between the junction region and the channel region is increased, thereby improving the punch-through characteristic.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a method for fabricating a DRAM cell transistor according to a preferred embodiment of the present invention will be described with reference to the accompanying drawings.

Figure 5A:
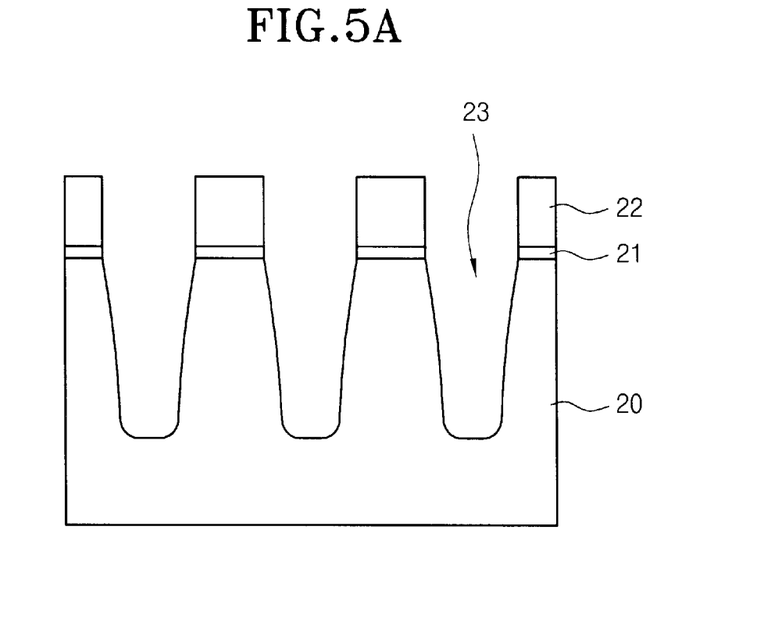
FIGS. 5A to 5J are cross-sectional views illustrating a method for fabricating a DRAM cell transistor according to a preferred embodiment of the present invention, which are shown based on a section taken along the line V—V of FIG. 1.

FIGS. 5A to 5J are cross-sectional views showing a method for fabricating a DRAM cell transistor according to a preferred embodiment of the present invention, which are shown based on a section taken along the line V—V of FIG. 1; and As shown in FIG. 5A, a pad oxide film 21 and a pad nitride film 22 are successively deposited on the surface of a silicon substrate 20, and then selectively etched so as to form a trench 23 within the silicon substrate 20 at a fixed region.

Figure 5B:
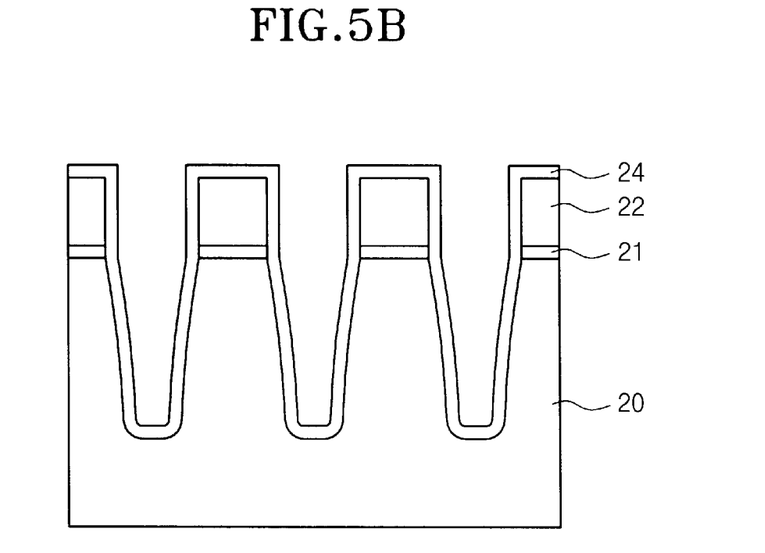

Next, the sidewall of the trench is oxidized, after which, as shown in FIG. 5B, a liner nitride film 24 is deposited on the exposed surface of the entire structure. The liner nitride film 24 serves as an etch barrier in a subsequent polysilicon etch-back process for forming an electrode in the inside of a field oxide film.

Figure 5C:
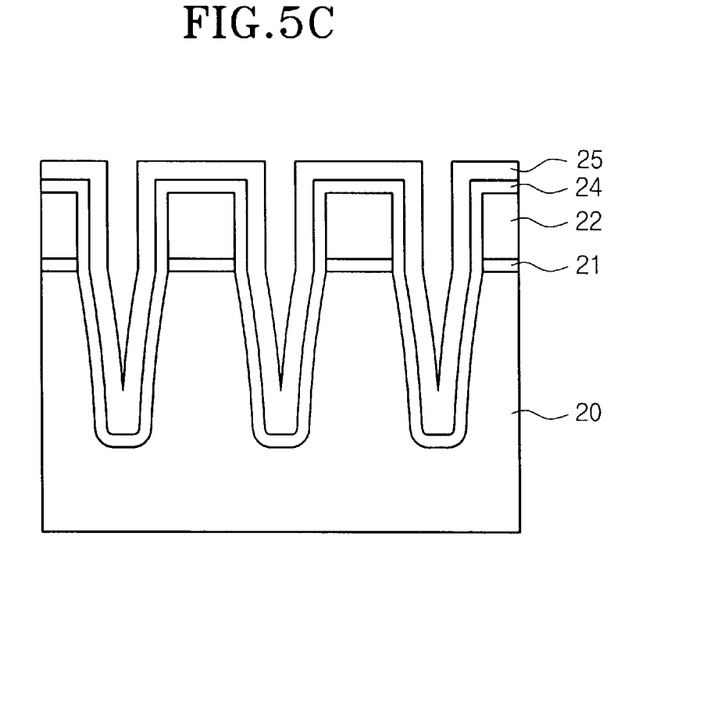

As shown in FIG. 5C, a spacer oxide film 25 is then deposited on the liner nitride film 24 in order to form a sidewall oxide film on the inner sidewall of the trench 23.

Figure 5D:
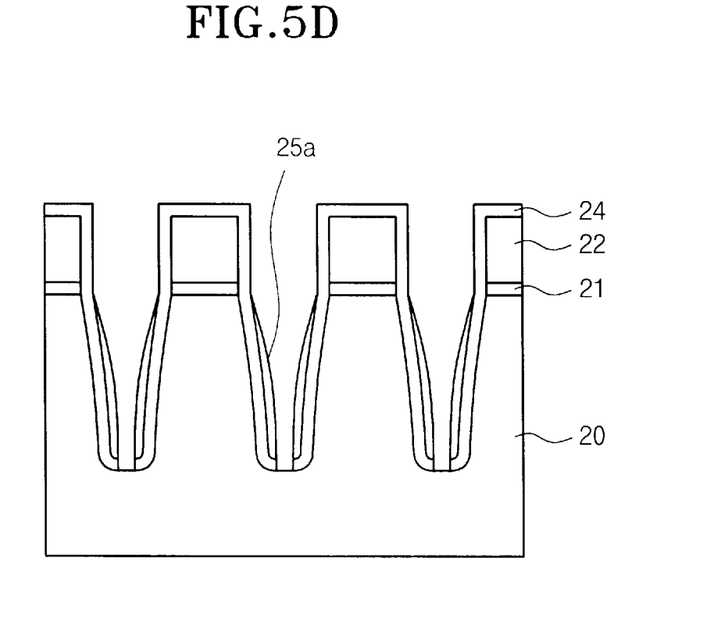

As shown in FIG. 5D, the spacer oxide film is etched according to a blanket etching process so as to form a sidewall oxide film 25a on the inner sidewall of the trench 23. Following this, using the oxide film 25a as an etch barrier, a portion of the liner nitride film, which is located at the bottom portion of the trench 23, is selectively removed. As a result, the silicon substrate 20 is exposed at the bottom of the trench 23.

Figure 5E:
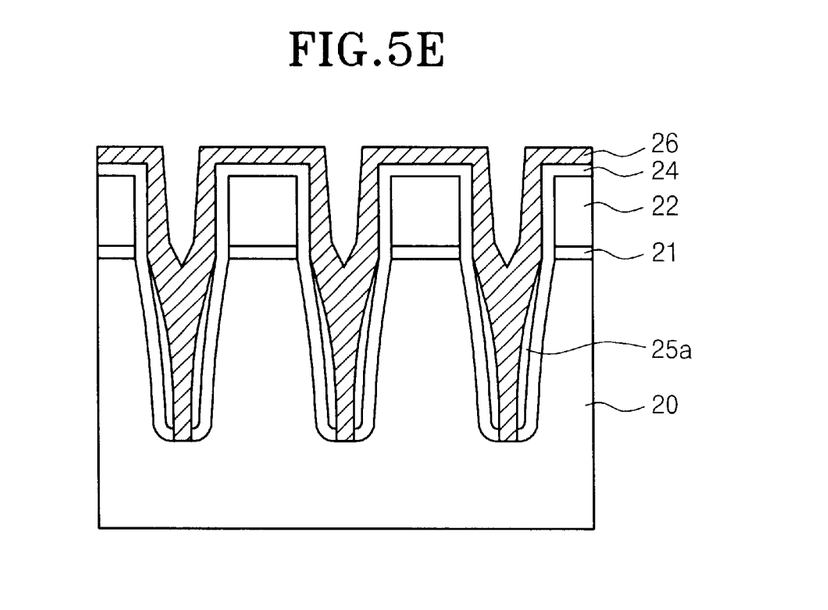

As shown in FIG. 5E, a first doped polysilicon layer 26, which is used to form a first electrode, is then deposited on the entire surface of the resulting structure. At this time, the first polysilicon layer 26 is doped with an impurity of the same conductive type as that of a well region.

Figure 5F:
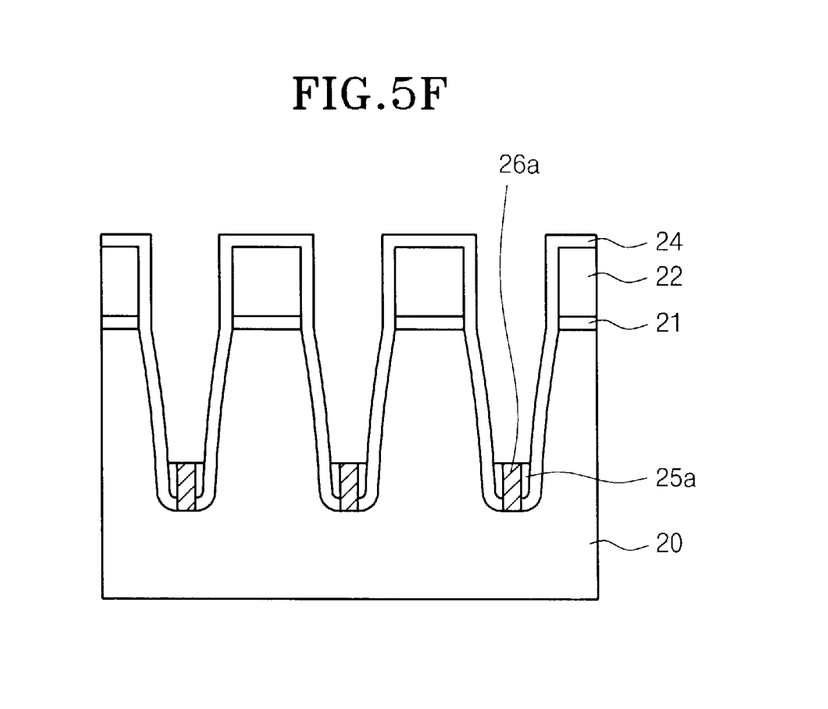

As shown in FIG. 5F, the first polysilicon layer is then etched back in such a manner that it partially remains only on the bottom portion of the trench. Thus, a first electrode 26a is formed. At this time, the liner nitride film 24 serves as an etch barrier, and the oxide film 25a is also removed together with the polysilicon layer.

Figure 5G:
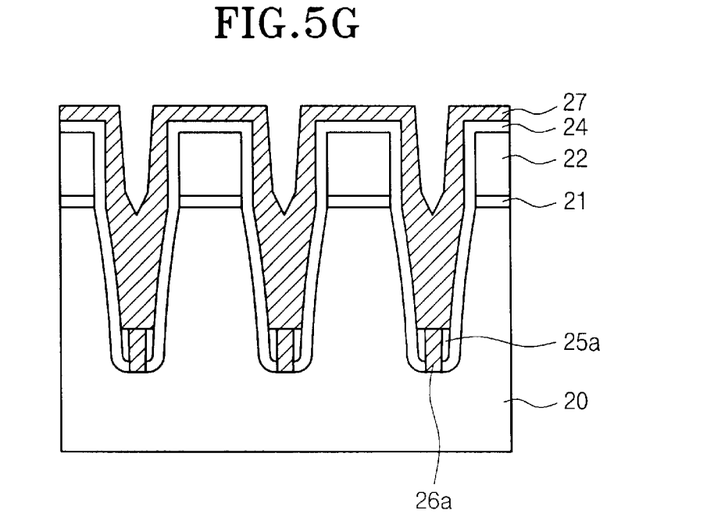

As shown in FIG. 5G, a second doped polysilicon layer 27, which is used to form a second electrode, is then deposited on the entire surface of the resulting structure. At this time, the second polysilicon layer 27 is doped with an impurity of the same conductive type as that of the first electrode 26a.

Figure 5H:
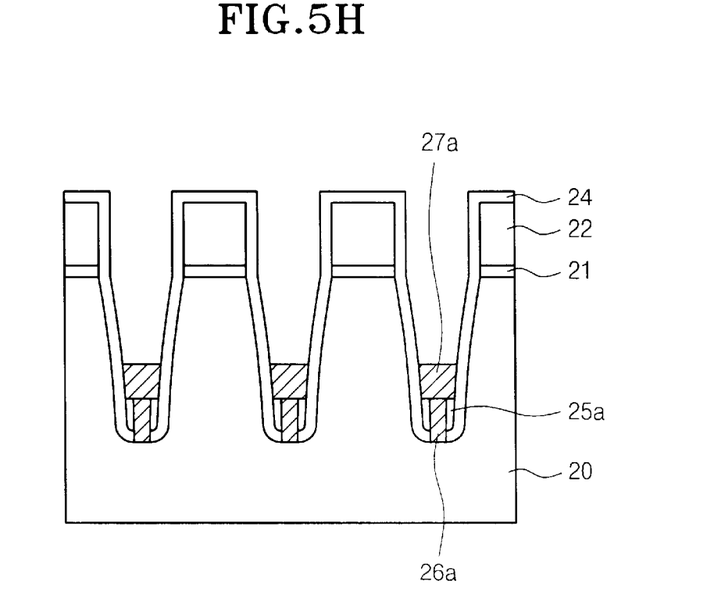

As shown in FIG. 5H, the second polysilicon layer is then etched back in such a manner that it partially remains only on the bottom portion of the trench 23. This etch-back process provides a second polysilicon layer 27a. At this time, the liner nitride film 24 serves as an etch barrier.

Figure 5I:
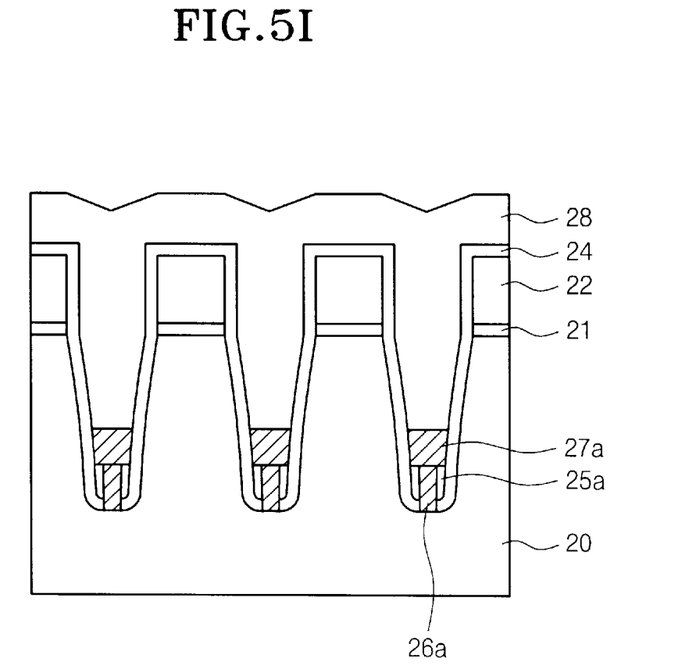

As shown in FIG. 5I, an oxide film 28 is then deposited on the entire surface of the resulting structure in such a manner that the trench 23 is filled with the oxide film 28.

Figure 5J:
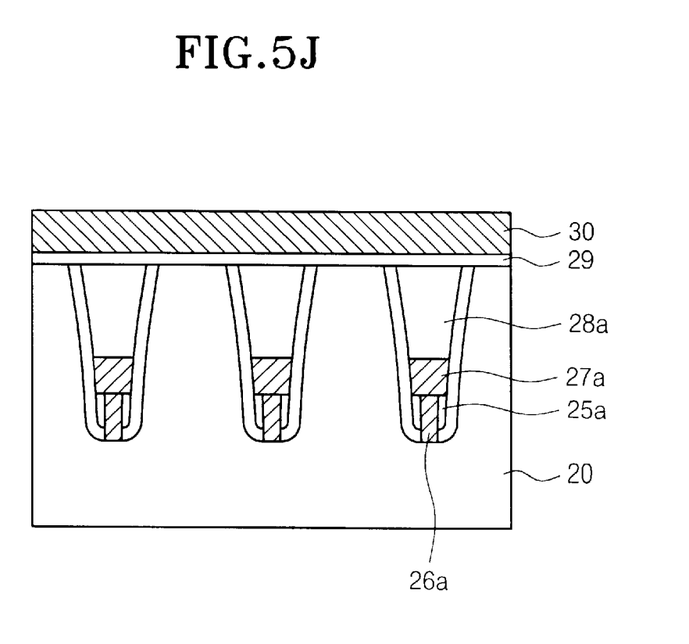

As shown in FIG. 5J, a field oxide film 28a is formed within the trench 23 by a chemical mechanical polishing (CMP) process. Thereafter, a gate oxide film 29, a gate line 30 and a source/drain region (not shown) are formed according to general DRAM processes. In this way, a DRAM cell transistor is fabricated.

The operation of the DRAM cell transistor, which is fabricated as described above, will now be described.

Figure 6:
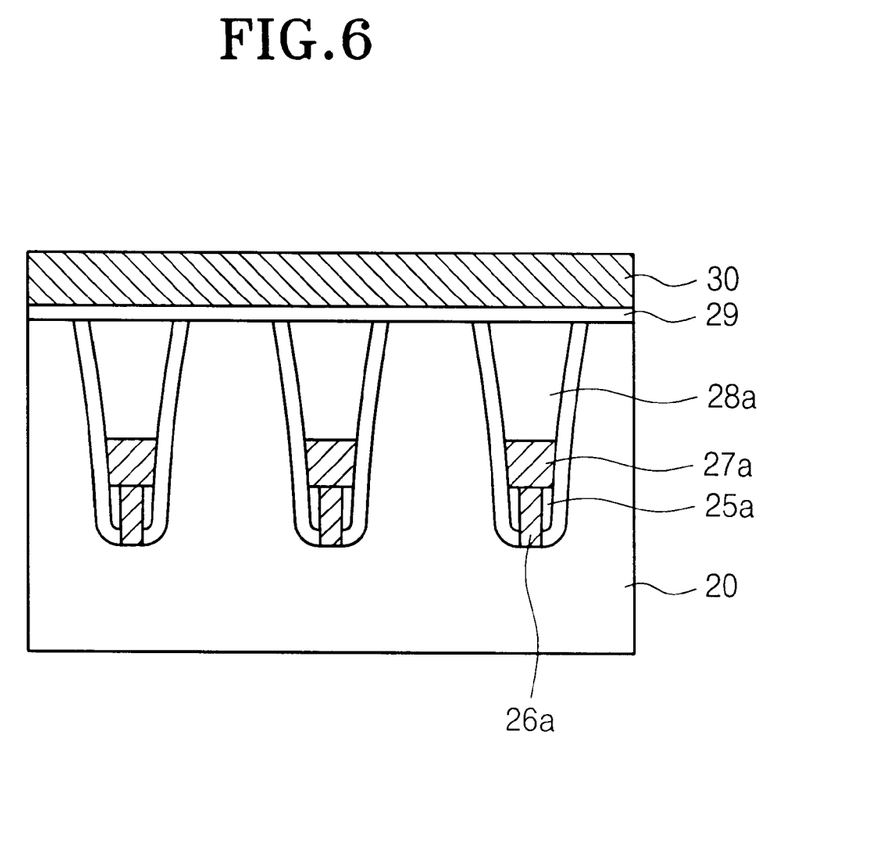
FIG. 6 is a cross-sectional view, which illustrates the operation of a DRAM cell transistor fabricated according to a preferred embodiment of the present invention.

FIG. 6 is a cross-sectional view showing the operation of the DRAM cell transistor fabricated according to the preferred embodiment of the present invention. Referring to FIG. 6, the polysilicon electrodes 26a and 27a formed within the trench 23 are applied with the same voltage as a back bias applied to the well region of the DRAM cell. Then, a channel region is formed on the surface portion of the active region during the operation of the cell transistor, so that electrons are collected at the channel region, holes are attracted to the edge portion of the field oxide film 28a where punch-through phenomenon is likely to be generated. As a result, the electric potential at the edge portion of the field oxide 28a is increased, so that the potential barrier between the source/drain junction region and the channel region is increased, thereby improving the punch-through characteristic.

Meanwhile, the reason why the first electrode 26a and the second electrode 27a are formed separately from each other is that it makes the first electrode 26a small, so that the electric potential at the bottom portion of the field oxide film 28a is reduced as far as possible and the potential barrier is effectively increased only at a portion which is weak against punch-through. Furthermore, the electrodes 26a and 27a are preferably formed to a depth of 500-1,500 Å from the bottom surface of the field oxide film 28a.

As apparent from the foregoing, the DRAM cell transistor fabricated according to the present invention includes the electrode structure, which was formed within the field oxide film so as to have the same conductive type as that of the well region. For this reason, the back bias is applied to the well region, and at the same time, also applied to the electrodes within the field oxide film. Thus, the electric potential at the edge portion of the field oxide film is increased and the potential barrier between the junction region and the channel region is increased, thereby improving the punch-through characteristic.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a DRAM cell transistor having a substrate having a well region therein, comprising the steps of:

forming an isolation french in a the silicon substrate at a fixed region;

forming an electrode on the bottom portion inside the isolation trench, the electrode being the same conductive type of the well region;

forming a field oxide film inside the isolation trench and above the electrode formed inside the isolation trench; and forming a source/drain junction region in the well region, wherein, when a voltage is applied to the well region, the substantially same voltage is also applied to the electrode in the isolation trench so as to increase the potential barrier in a portion of the isolation trench having the field oxide and the electrode inside thereof that is weak against punch-through.

2. The method of claim 1, wherein the step of forming an isolation trench comprises the sub-steps of:

forming a pad oxide film on the substrate having the well region;

forming a pad nitride film on the pad oxide film; and selectively etching the pad nitride film, the pad oxide film and the silicon substrate.

3. The method of claim 1, further comprising the step of depositing a liner nitride film on the exposed surface of the substrate after forming the isolation trench.

4. The method of claim 3, further comprising the step of oxidizing the sidewall of the isolation trench, before depositing the liner nitride film on the exposed surface of the substrate.

5. The method of claim 3, further comprising the step of forming a sidewall oxide film on the inner sidewall of the isolation trench, after depositing the liner nitride film on the exposed surface of the substrate.

6. The method of claim 5, wherein the step of forming the sidewall oxide film comprises the sub-steps of:

depositing a spacer oxide film on the surface of the liner nitride film; and etching the spacer oxide film by a blanket etching process, while leaving a layer of oxide film on the sidewall of the isolation trench.

7. The method of claim 5, further comprising the step of removing a portion of the liner nitride film, which is located at the bottom portion of the isolation trench, using the sidewall oxide film as an etch barrier, after forming the sidewall oxide film.

8. The method of claim 1, wherein the step of forming the electrode having a first electrode and a second electrode comprises the sub-steps of:

forming a sidewall oxide film on the sidewall of the isolation trench;

forming the first electrode on the bottom portion inside the isolation trench, the first electrode being surrounded by the sidewall oxide film; and forming a second electrode on the first electrode.

9. The method of claim 1, wherein the electrode is formed of a polysilicon layer.

10. The method of claim 5, wherein the electrode comprises a first electrode and a second electrode, and further wherein the step of forming the electrode comprises the sub-steps of:

depositing a first doped polysilicon layer on at least the sidewall oxide film and the nitride layer in the isolation trench;

forming a first electrode surrounded by the sidewall oxide film in the bottom portion of the isolation trench by removing a predetermined amount of the first doped polysilicon layer and the sidewall oxide film in the upper portion of the isolation trench; and depositing a second doped polysilicon layer on at least the first electrode and the sidewall oxide film in the bottom portion of the isolation trench.

* * * * *